(12) United States Patent
Liu

(10) Patent No.: US 6,809,036 B2
(45) Date of Patent: Oct. 26, 2004

(54) DRY SILYLATION PLASMA ETCH PROCESS

(75) Inventor: Lianjun Liu, Chandler, AZ (US)

(73) Assignee: Tokyo Electron Limited, Tokyo (JP)

(*) Notice: Subject to any disclaimer, the term of this patent is extended or adjusted under 35 U.S.C. 154(b) by 242 days.

(21) Appl. No.: 10/259,808

(22) Filed: Sep. 30, 2002

(65) Prior Publication Data

US 2003/0054658 A1 Mar. 20, 2003

Related U.S. Application Data

(63) Continuation of application No. PCT/US01/09198, filed on Mar. 23, 2001.
(60) Provisional application No. 60/193,270, filed on Mar. 30, 2000.

(51) Int. Cl.[7] ............................................. H01L 21/302
(52) U.S. Cl. ...................................... 438/710; 438/425
(58) Field of Search ............................. 438/706, 710, 438/714, 715, 725; 430/313, 314

(56) References Cited

U.S. PATENT DOCUMENTS

| | | | |
|---|---|---|---|
| 4,882,008 A | * 11/1989 | Garza et al. | ................. 216/48 |
| 4,918,031 A | 4/1990 | Flamm et al. | |
| 5,234,529 A | 8/1993 | Johnson | |
| 5,275,896 A | * 1/1994 | Garofalo et al. | ................ 430/5 |
| 5,362,606 A | 11/1994 | Hartney et al. | |
| 5,366,852 A | 11/1994 | Pavelchek et al. | |
| 5,460,693 A | * 10/1995 | Moslehi | ....................... 438/766 |
| 5,486,424 A | * 1/1996 | Nakato et al. | ............... 428/451 |
| 5,487,967 A | * 1/1996 | Hutton et al. | ................ 430/322 |
| 5,550,007 A | * 8/1996 | Taylor et al. | ................ 430/314 |
| 5,562,801 A | 10/1996 | Nulty | |
| 5,700,628 A | 12/1997 | Moslehi | |
| 5,942,447 A | 8/1999 | Miyakuni | |

OTHER PUBLICATIONS

Dijkjstra, "Oxygen magnetically enhanced reactive ion etching of silylated resist patterns," Journal of Vacuum Science and Technology B (Microelectronics Processing and Phenomena), USA, Sep.–Oct. 1992, vol. 10, No. 5, pp. 2222–2229.

* cited by examiner

Primary Examiner—Kin-Chan Chen
(74) Attorney, Agent, or Firm—Pillsbury Winthrop LLP

(57) ABSTRACT

A dry silylation process involving plasma etching of a substrate (100) having an upper surface (100S) coated with a first layer (L1) of silylatable material with one or more silylated regions (S1, S2) formed therein. The plasma (66) is oxygen-based plasma having a first region (66L) with a low plasma density and high radical density, and a second region (66U) having a high plasma density and a low radical density. The process includes the steps of exposing the one or more silylated regions to the first plasma region to form respective one or more oxidized regions (OR1, OR2) from the one or more silylated regions. The next step is then exposing the substrate to the second plasma region to selectively etch the silylatable material that is directly exposed to the plasma. The process of the present invention can be used, for example, to form photoresist patterns (P) having straight (vertical) sidewalls (SW) in the fabrication of a semiconductor device.

15 Claims, 8 Drawing Sheets

DRY SILYLATION PLASMA ETCH PROCESS

This is a continuation of International Application No. PCT/US01/09198 which was filed on Mar. 23, 2001, and also claims benefit of U.S. Application No. 60/193,270, filed Mar. 30, 2000, the contents of both of which are incorporated herein in their entirety.

FIELD OF THE INVENTION

The present invention pertains to semiconductor processing, and more particularly to a dry lithographic silylation plasma etch process.

BACKGROUND OF THE INVENTION

There is an ever-increasing need to improve the resolution of lithographic processes in semiconductor device fabrication. Existing processes include the use of liquid chemicals to remove photoresist after it has been exposed to form a photoresist pattern. However, such wet processes are isotropic, and cause the edges of the photoresist pattern to be undercut by an amount that depends on photoresist thickness, age, the curing process, and exposure. This effect can cause considerable variation in the size of the photoresist patterns used in forming the structure of a semiconductor device. As the required critical dimensions of the photoresist patterns decrease, this problem becomes more acute.

With the high numerical aperture (NA) lenses necessary for performing state-of-the-art deep sub-micron photolithography, the depth of focus is rather small, i.e., less than 1 micron. This is because the depth of focus is inversely proportional to the square of the NA, while the resolution is proportional to the NA. In certain situations, the depth of focus of a lens having sub-micron resolution may be less than the thickness of the photoresist layer in which a pattern is to be formed. This can cause the resultant photoresist pattern to be less than ideal i.e., have non-vertical sidewalls.

Silylation is a dry lithographic process that includes forming a very thin, usually patterned, layer of oxidized silicon on the surface of a photoresist layer deposited atop a substrate such as a silicon wafer. To form this thin oxide layer, the photoresist layer is selectively exposed (e.g., through a mask) with actinic radiation (e.g., UV light or an electron beam), thereby forming portions of exposed and unexposed photoresist. After exposure, the photoresist is treated with a silicon-containing silylation reagent. The silicon-containing reagent diffuses and reacts with the surface of the exposed region of the photoresist, but not the un-exposed regions, thereby forming select regions of silylated photoresist on the surface of the photoresist layer.

With reference to FIG. 1A, there is shown a substrate 10 having thereon a photoresist layer 16 with an upper surface 18, with silylated resist portions 20 formed in the resist layer at the upper surface. The success of the dry developing process requires that the etch is highly selective in preferentially etching the unsilylated resist, and the etch is anisotropic such that it generates a vertical etch profile. In general, this requires good control of ion energy, ion flux and radical flux towards the photoresist layer. With reference now also to FIG. 1B, when the structure of FIG. 1A is etched using a conventional dry-etched silylation process, a photoresist pattern 32 with side-walls 36 and a cap layer 40 of $SiO_x$ can result at the silylated resist portions. In this case, the resist removal process is isotropic (i.e. acts uniformly in all directions) due to a high radical flux and low ion flux. Because there is an etch-resistant cap layer 40 atop photoresist 16, the photoresist underlying the cap layer 40 is unevenly removed, resulting in photoresist pattern 32 having curved sidewalls 36, such as shown in FIG. 1B. Under such conditions, the acceptable etch selectivity is attained, however, at the expense of non-vertical side-wall profiles (i.e. there are too few ions to produce a directional etch). Alternatively, in an attempt to increase the relative ion flux, one inherently increases the ion energy as well. While achieving vertical side-wall profiles, this, in turn, leads to the etching of both the hard mask (i.e. $SiO_x$ layer) and the unsilylated photoresist regions (poor selectivity). Both cases adversely affect process control and ultimately, the performance of the semiconductor device being fabricated. Either of these effects is commonly observed in conventional dry developing silylation processes.

There are several prior art patents pertaining to dry processes in the fabrication of semiconductor devices. For example, U.S. Pat. No. 5,700,628 describes an all-dry microlithography process, where a fluorinated layer is deposited on a processable layer of a semiconductor wafer, and regions of the fluorinated layer are exposed to a masked radiation source so that exposed regions and unexposed areas are formed in the fluorinated layer. An oxide layer is grown on the fluorinated layer, forming a thicker region of oxide on the unexposed areas of the fluorinated layer, and forming thinner regions of oxide on the exposed regions of the fluorinated layer. The oxide layer is then etched, removing thinner regions of the oxide layer but leaving at least a fraction of the thicker portions of the oxide layer to be used as a patterned hard mask. Then, the exposed fluorinated layer not covered by the patterned oxide hard mask is etched to expose areas of the processable layer not covered by the oxide hard mask, for subsequent patterned processing. The subsequent patterned processing may be an etch process for pattern transfer to the processable layer, a doping process to dope the exposed regions of the processable layer, or another process such as a deposition step. The all-dry lithography process can be completed in an integrated environment, such as a cluster tool, resulting in improved manufacturing cycle time and increased yields. The dry photo-sensitive layer may be deposited using PECVD at low temperatures, and is compatible with all other semiconductor device fabrication, process flows. However, a shortcoming of this invention is that it involves a large number of processing steps, which consumes a large amount of time, which reduces device manufacturing throughput.

U.S. Pat. No. 5,366,852 describes a process for treating photoresists and forming photoresist relief images, the process comprising the steps of providing a photoresist coating having a cross-linked surface layer, treating the photoresist coating with an organo-metallic material, and developing the photoresist coating to provide a relief image comprising an etch resistant effective amount of organo-metallic material.

U.S. Pat. No. 5,362,606 describes an invention in which a resist exposed to a micron or sub-micron pattern of highly absorbed ion beams forms a highly crosslinked barrier layer in the exposed regions of the resist surface. The complementary surface regions are silylated in a silicon-containing reagent, and the exposed regions are then removed by a plasma etch. Pattern definition is enhanced by limiting the exposure and the silylation to the surface of the resist. The process allows feature definition below 1000 Angstroms using a relatively inexpensive single element low energy ion source. However, a shortcoming of this invention is that it utilizes an oxygen reactive ion etch (RIE) reactor with characteristically a low density of high energy ions (energies of order 200 eV), which is not desirable because the ion energy is sufficient to exceed the sputter threshold of the SiO$_x$ hard mask (i.e., the hard mask is sputter etched).

U.S. Pat. No. 5,562,801 describes a process of etching an oxide layer. First, a resist layer is formed on an oxide layer on a substrate. Next, a photo-sensitive layer is formed on the oxide layer and patterned to expose regions of the oxide layer to be removed. The exposed regions may overlie a nitride layer, and may overlie a structure such as a polysilicon gate. The etch is performed such that polymer deposits on the photo-sensitive layer, thus eliminating interactions between the photo-sensitive layer and the plasma. In this way, a simple etch process allows for good control of the etch, resulting in reduced aspect ratio dependent etch effects, high oxide:nitride selectivity, and good wall angle profile control. However, a shortcoming of this invention is that it requires a relatively large number of process steps and includes the formation of numerous layers of material, which adds cost and complexity to the process.

BRIEF SUMMARY OF THE INVENTION

The present invention pertains to semiconductor processing, and more particularly to a dry lithographic silylation plasma etch process.

A first aspect of the invention is a process of plasma etching a substrate having an upper surface coated with a first layer of silylatable material with one or more silylated regions formed therein. The plasma is oxygen-based and has a first region with a low plasma density and high radical density, and a second region having a high plasma density and a low radical density. The process comprises the steps of exposing the one or more silylated regions to the first plasma region to form respective one or more oxidized regions from the one or more silylated regions. The next step is then exposing the substrate to the second plasma region to selectively etch the silylatable material directly exposed to the plasma.

A second aspect of the invention is the process as described above, wherein the process is carried out in the chamber of a plasma processing system, and further includes at least one of the following steps in adjusting the process:

a) adjusting an amount of RF power coupled to the second plasma region;

b) adjusting an RF bias applied to the substrate;

c) adjusting a flow of a gas (e.g., oxygen) to the plasma;

d) adjusting the pressure within the chamber; and e) varying the position of the substrate within the chamber.

DETAILED DESCRIPTION OF THE INVENTION

The present invention pertains to semiconductor processing, and more particularly to a dry lithographic silylation plasma etch process. The process may be used to more efficiently fabricate photoresist patterns in the process of fabricating semiconductor devices, such as integrated circuits. The process is particularly effective in forming photoresist patterns having vertical side-walls.

The process of the present invention is carried out in a plasma processing system, such as an electrostatically shielded radio frequency (ESRF) plasma system, as described in U.S. Pat. No. 4,918,031 (hereinafter referred to as the '031 patent) and U.S. Pat. No. 5,234,529 (hereinafter referred to as the '529 patent). The entirety of the '529 patent and the '031 patent are incorporated herein by reference.

Figure 1A:
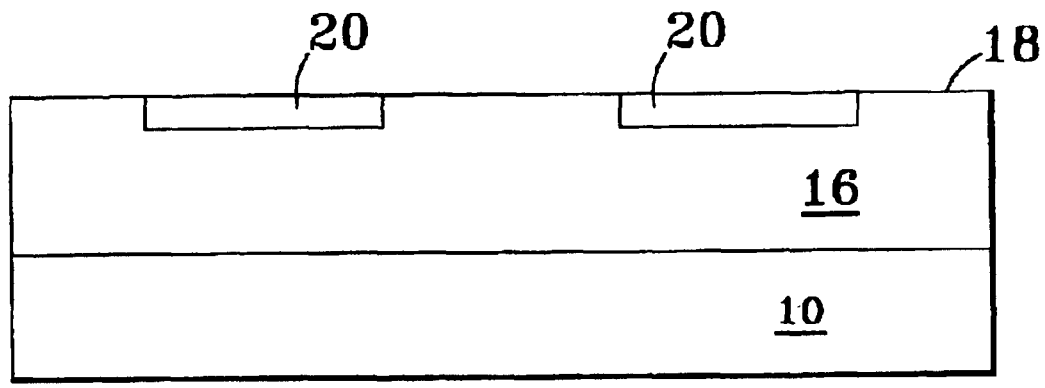
FIG. 1A is a cross-sectional diagram of a semiconductor structure comprising a photoresist layer having silylated portions formed therein at the top of the photoresist layer.
Figure 1B:
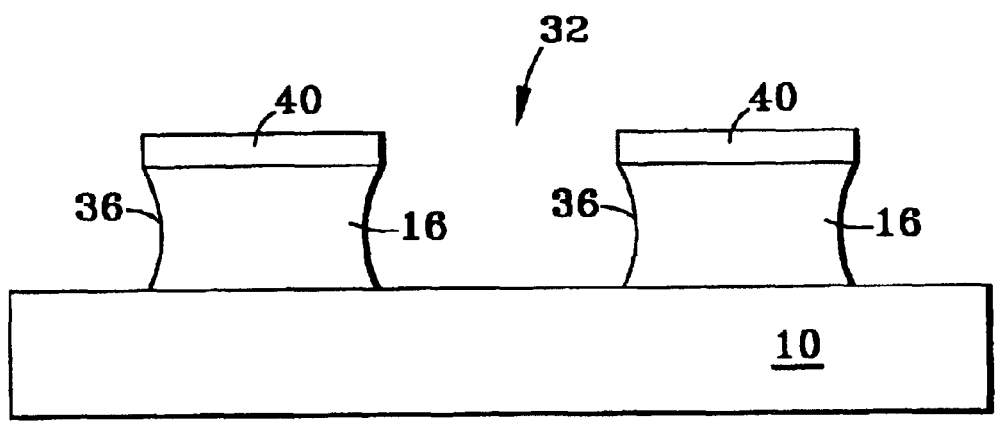
FIG. 1B is a cross-sectional diagram of the semiconductor structure of FIG. 1A having been developed using a conventional dry-etch silylation process.
Figure 2A:
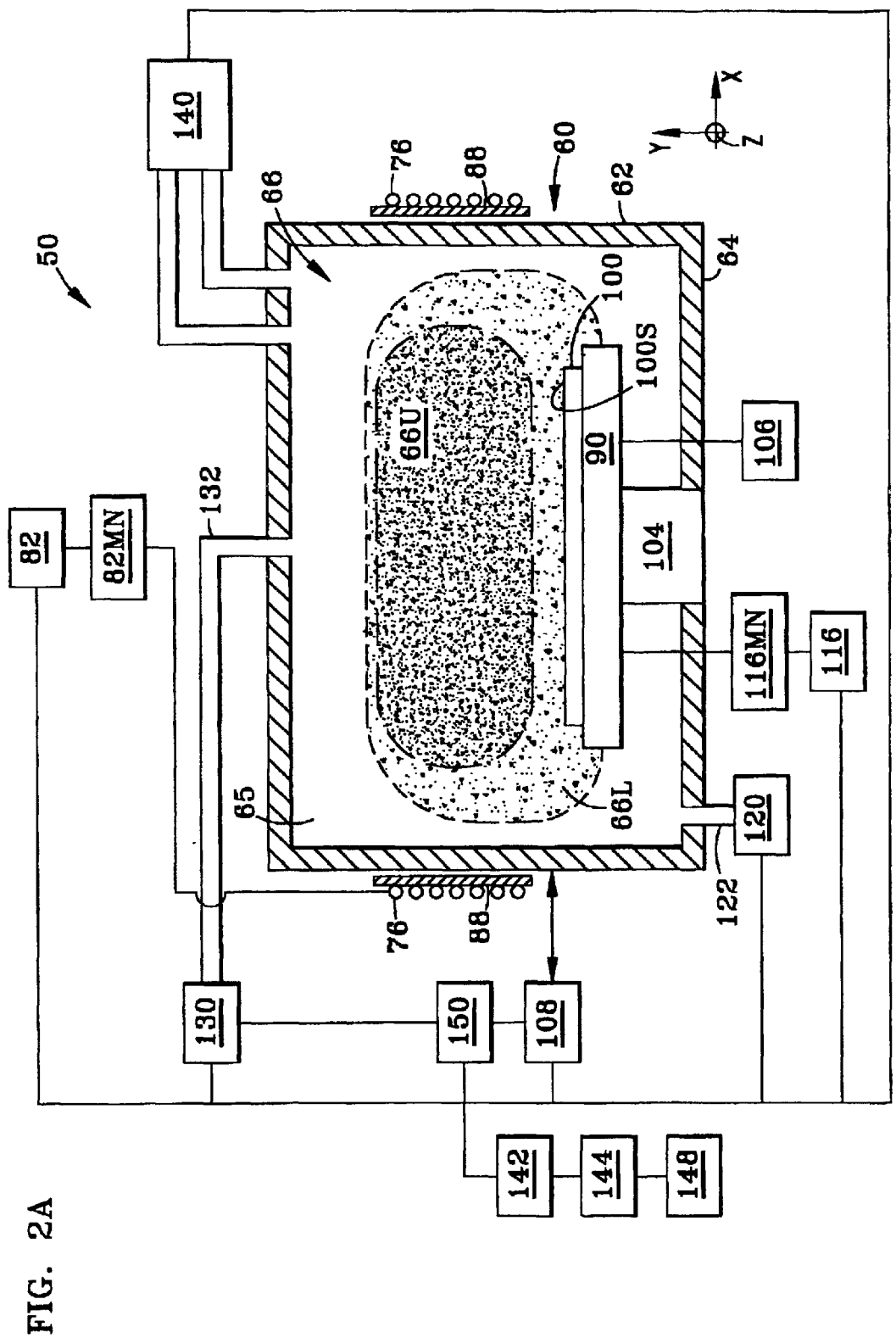
FIG. 2A is a schematic cross-sectional diagram of a plasma processing system for carrying out the process of the present invention.

With reference to FIG. 2A, a plasma processing system 50 suitable for carrying out the process of the present invention comprises a plasma chamber 60 having an outer side wall 62, a lower wall 64, and an interior region 65. Chamber 60 is capable of containing within interior region 65 a plasma 66 having a high density (e.g., from about 1–5×10$^{12}$ ions/cm$^3$) and a low plasma potential (e.g., on the order of about 5–10 volts). Plasma 66 has a lower (i.e., first) region 66L and an upper (i.e., second) region 66U, the properties of which are described further below.

Figure 2B:
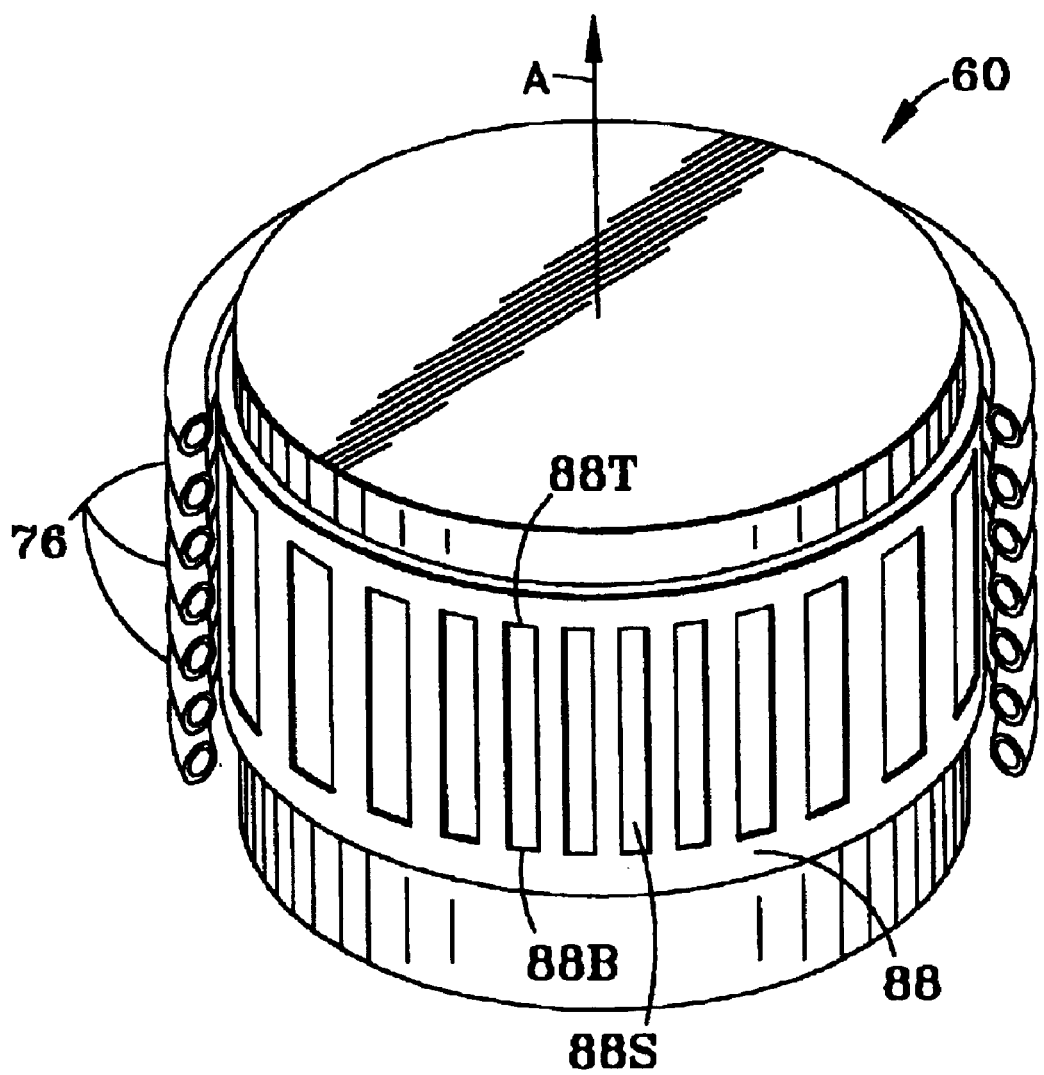
FIG. 2B is a perspective schematic diagram of the chamber of the plasma processing system of FIG. 2A showing the arrangement of the induction coils and the E-shield slots.

With reference also to FIG. 2B, surrounding chamber 60 so as to encircle interior region 65 is an inductive coil 76. Inductive coil 76 may be a helical resonator (i.e. a quarter-wave or half-wave resonator), wherein one coil end is grounded, and the opposite coil end is open. Coil 76 is tapped near the grounded end, whereby the coil is electrically connected to a RF power supply 82 through a match network 82MN. The latter is used to maximize RF power transfer to plasma 66.

Between inductive coil 76 and chamber wall 62 is a grounded electrostatic shield 88 (also referred to as an E-shield or Faraday shield) comprising an electrically grounded, conductive sheet with slots 88S each having a bottom 88B and a top 88T. Slots 88S are aligned parallel with the axis of revolution A of chamber 60 (i.e., in the Y-direction) and are typically equally spaced. Slots 88S may have a width, for example, of between 1 mm–10 mm. E-shield 88 minimizes capacitive coupling between coil 76 and plasma 66 by limiting the area through which the electromagnetic field from the coil can couple to the plasma.

With continuing reference to FIG. 2A, system 50 further includes a substrate support member 90 (i.e. a chuck) located within chamber 60, for supporting a substrate (e.g., a wafer) 100 having an upper surface 100S. Attached to substrate support member 90 is a lifting member 104 used to adjust the position of the substrate support member (and thus substrate 100) within chamber 60. Lifting member 104 is operably connected to a lifting member control unit 106 that controls the activation of the lifting member, so that the position of substrate 100 within chamber 60 can be adjusted, for reasons explained in more detail below. Suitable lifting members and control units therefor are known in the art.

It is well known in the art that when employing a shielded, inductively coupled RF system for plasma generation, the density of plasma 66 begins to decay rapidly with position as one moves below bottom 88B of E-shield slots 88, relative to the variations in the plasma density within the cylindrical region bounded by upper and lower limits imposed by top 88T and bottom 88B of slots 88S in E-shield 88, respectively (FIG. 2B). As substrate surface 100S is moved vertically downward (i.e., in the Y-direction) from the plane defined by bottom 88B of the E-shield slots, the plasma density proximate substrate surface 100S decays. The rate of plasma density decay and the distance over which the plasma density decays is strongly dependent upon the pressure within chamber 60. For example, as the pressure in interior region 65 of chamber 60 is increased, the rate of plasma decay is increased and the subsequent distance over which the plasma density decays appreciably is shortened (i.e. the distance over which the plasma density decays appreciably is of the order several mean free paths; the mean free path of Argon at 5 mTorr is approximately 1 cm and for Argon at 100 mTorr is approximately 0.5 mm). With reference to FIG. 2A, a long-dashed line is employed to indicate the boundary of "high" plasma density region 66U (of order $10^{12}$ ion/cm$^3$), wherein the bottom of this region is more or less coincident with the bottom of the E-shield slots 88B. This is a position suitable for locating substrate 100 proximate to region 66U having high plasma density. With reference to FIG. 2, a short-dashed line is employed to indicate the boundary of "low" plasma density region 66L (of order 1 to 2 orders of magnitude less than the above described region). This is a position suitable for locating the substrate 100 proximate to region 66L of low plasma density.

With continuing reference to FIG. 2A, system 50 further includes a wafer handling system 108 for transporting wafers in and out of chamber 60 and to and from substrate support member 90, as well as to and from other systems and units described below. Such systems are well known in the art. Electrically connected to substrate support member 90 is a substrate power supply 116 and a match network 116MN used to apply a bias to substrate 100.

System 50 also includes a known vacuum pump system 120 pneumatically connected to chamber 60 through a vacuum line 122. Further included in system 50 is a known gas supply delivery system 130 pneumatically connected to chamber 60 via a gas line 132. Vacuum pump system 120 and gas supply system 130 together are capable of reducing the pressure in chamber 60 to approximately 1 mTorr–1 Torr in an oxygen ambient.

System 50 also includes a known cooling system 140 in fluid communication with chamber 60, for cooling the chamber so that it remains within acceptable limits.

In addition, connected to plasma processing system 50 is a silylation unit 142 for the silylation of the exposed regions of the photoresist layers by introducing a silylation reagent such as hexamethyldisilizane (HMDS), silane, etc., a resist apply/bake unit 144 for applying photoresist layer onto substrate 100 and then baking the photoresist layer, and an exposure system 148 for exposing the photoresist layer with actinic radiation. Exposure system 148 may be, for example, an e-beam tool or a photolithographic stepper or scanner projector having mid UV, deep UV or X-ray radiation. Units 142 and 144 and system 148 can all be constituted by known devices. For example, in unit 144, the those skilled in the art would be familiar with adjusting the parameters to obtain a resist coating of a particular thickness and uniformity, and would be aware of the temperature and bake time required to cure the resist. Moreover, workers in the art are familiar with the exposure time, depth of focus, etc. for the UV exposure unit 148. The same applies to the silylation unit 142.

System 50 also includes a main control system 150, electronically connected to RF power supply 82, match network 82MN, lifting member control unit 106, wafer handling system 108, substrate RF power supply 116, match network 116MN, vacuum pump system 120, gas supply system 130, cooling system 140, silylation unit 142, resist apply/bake unit 144 and exposure system 148. Control system 150 controls and coordinates the operation of the above-mentioned systems and units through respective electronic signals. In a preferred embodiment, system 50 in combination with silylation unit 142, resist apply/bake unit 144 and exposure system 148 constitutes a cluster-type photolithographic processing system. All of the above-mentioned components can be constituted by components known in the art or can be constructed on the basis of principles known in the art.

The Process of the Present Invention

Figure 3:
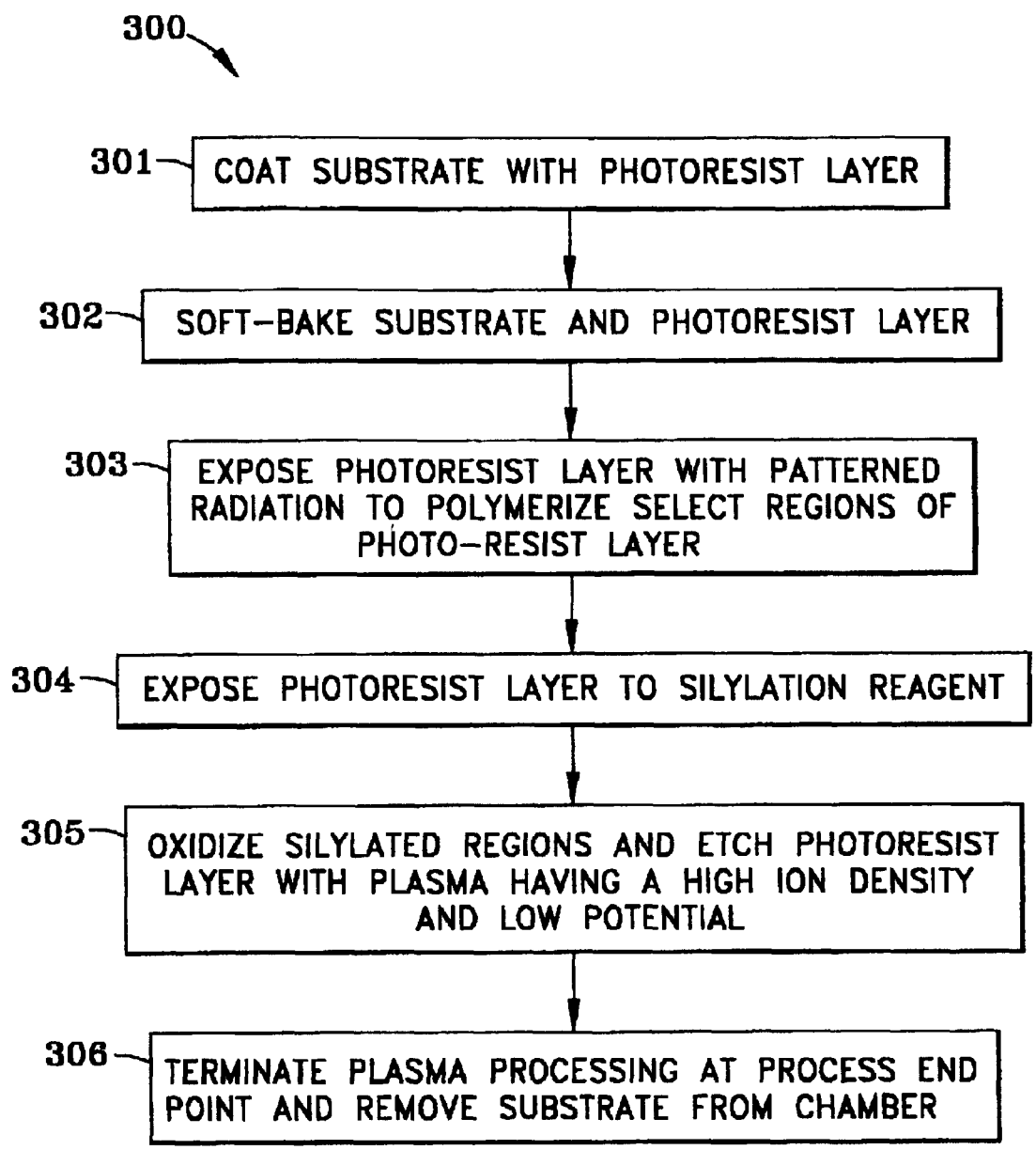
FIG. 3 is a flow diagram of the main steps of the process of the present invention.

With continuing reference to FIG. 2A, to flow diagram 300 of FIG. 3 and to FIGS. 4A–4E, the steps for carrying out the process of the present invention are now described. In a preferred embodiment, the process steps below are carried out in the above-described system 50 and silylation unit 142 and resist apply/bake unit 144 and exposure system 148 under the control and operation of control system 150 via respective electronic signals.

Figure 4A:
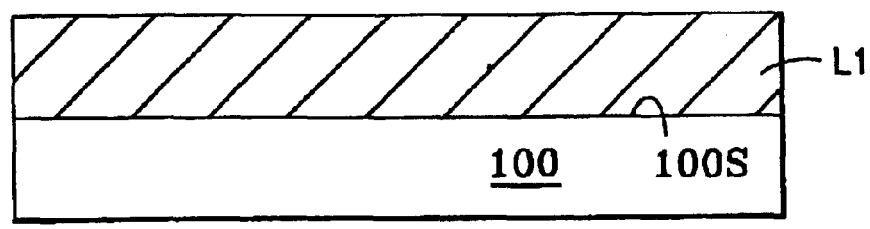
FIGS. 4A–4E are cross-sectional schematic diagrams of the substrate, photoresist layer, silylated regions and oxidized regions for the various steps of the process of the present invention.

In step 301, wafer handler system 108 procures a substrate 100 and places it in resist apply/bake unit 144. Substrate upper surface 100S is then coated with a suitable silylatable layer of material L1, such as photoresist. An example of a suitable material is Olin 810 positive photoresist (FIG. 4A).

In step 302, photoresist layer L1 is soft-baked by resist apply/bake unit 144 at a temperature in the range of about 80 to 115 degrees centigrade.

Figure 4B:
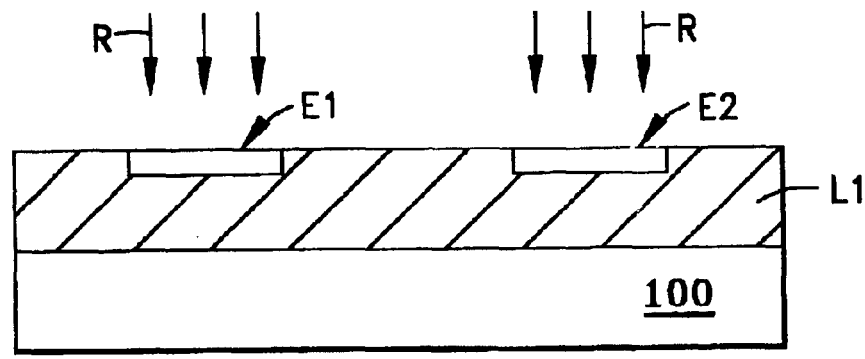

Next, in step 303, substrate 100 is removed from apply/bake control unit 144 by wafer handling system 108 and moved to exposure system 148, where photoresist layer L1 is exposed with patterned radiation R, such as patterned UV light or a patterned e-beam radiation (FIG. 4B). This is typically done by illuminating a mask with an e-beam or light source and imaging the mask onto the resist layer. This exposure polymerizes the exposed regions E1 and E2 of the photoresist. For an exposure system 148 having a shallow depth of focus, exposed regions E1 and E2 may only include an upper portion of photoresist layer L1.

Figure 4C:
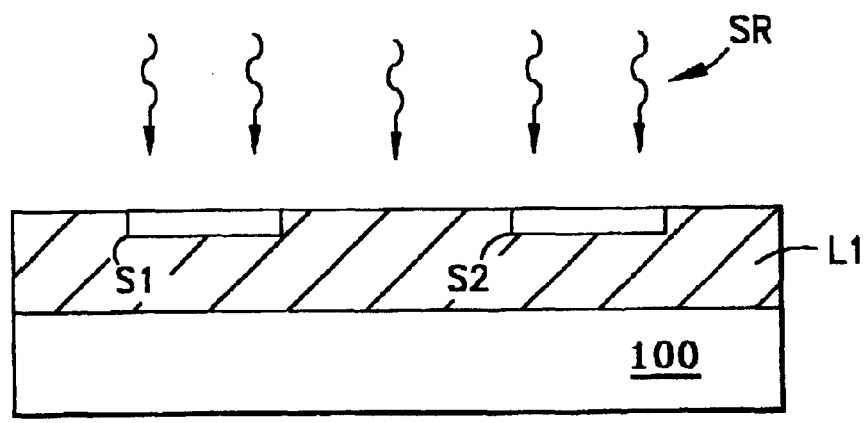
Figure 4D:
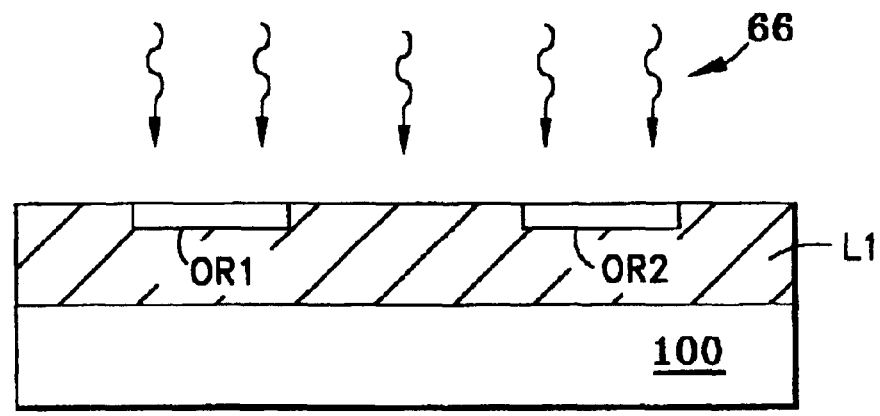

In the next step 304, wafer handling system 108 moves substrate 100 from exposure system 148 to silylation unit 142, where photoresist layer L1 is exposed to a silicon-containing silylation reagent SR, such as HMDS or silane (FIG. 4C). The reagent is allowed to diffuse into the photoresist and to react with exposed regions E1 and E2, causing these polymerized regions of the photoresist to be silylated, thus forming silylated regions S1 and S2.

Next, wafer handling system 108 removes substrate 100 from silylation unit 142 and places the substrate on substrate support member 90 within chamber 60. When the pressure in chamber 60 reaches a desired point, control system 150 sends an electronic signal to activate RF power supply 82 to ignite plasma 66. Plasma 66 is formed to have an overall high plasma density and low plasma potential. The operating conditions of RF power supply 82, as well as those of substrate RF power supply 116, are adjusted according to a predetermined process recipe stored in control system 150.

Figure 4E:
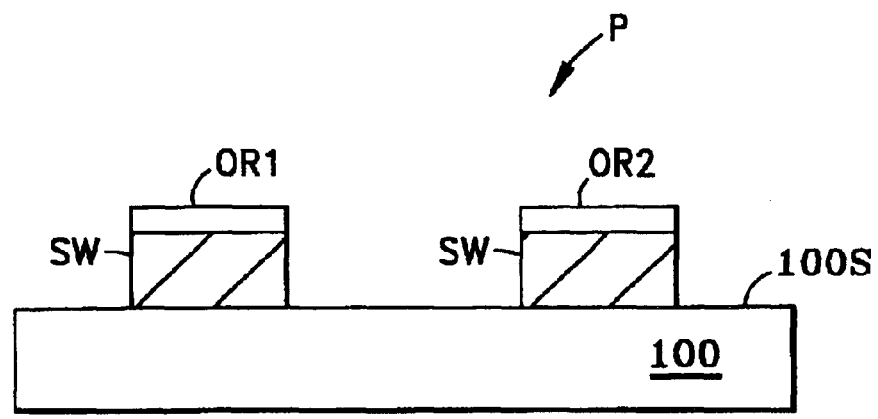

Once plasma 66 is so formed, then in step 305 photoresist layer L1, with silylated regions S1 and S2, is exposed to (oxygen) plasma 66 to convert silylated regions S1 and S2 to thin oxide regions OR1 and OR2 of silicon oxide, $SiO_x$ (FIG. 4D), and to etch the photoresist layer to form a photoresist pattern. Oxide regions OR1 and OR2 are more resistant to etching than the underlying unexposed (and thus unchanged) photoresist layer L1. The precise steps involved in performing step 305 are discussed in greater detail below. Step 305 is carried out until the desired photoresist pattern P with the desired sidewalls SW (e.g. vertical side-walls) is formed on substrate 100 (FIG. 4E).

Next, in step 306, when the process endpoint is reached, exposure of substrate 100 to plasma 66 is terminated, and wafer handling system 108 removes the substrate from chamber 60.

Figure 6A:
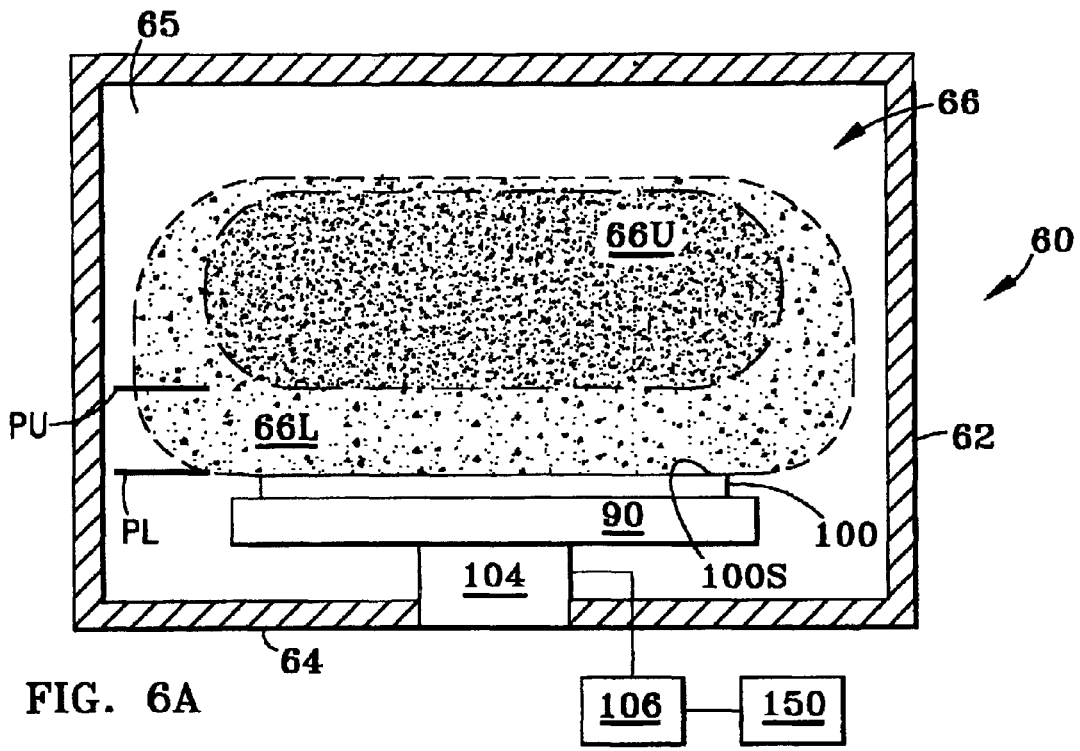
FIGS. 6A and 6B are cross-sectional diagrams of the chamber of the plasma processing system of FIG. 2, showing the substrate arranged in the lower position (FIG. 6A) and the upper position (FIG. 6B) corresponding to lower and upper regions of the plasma contained within the chamber.
Figure 6B:
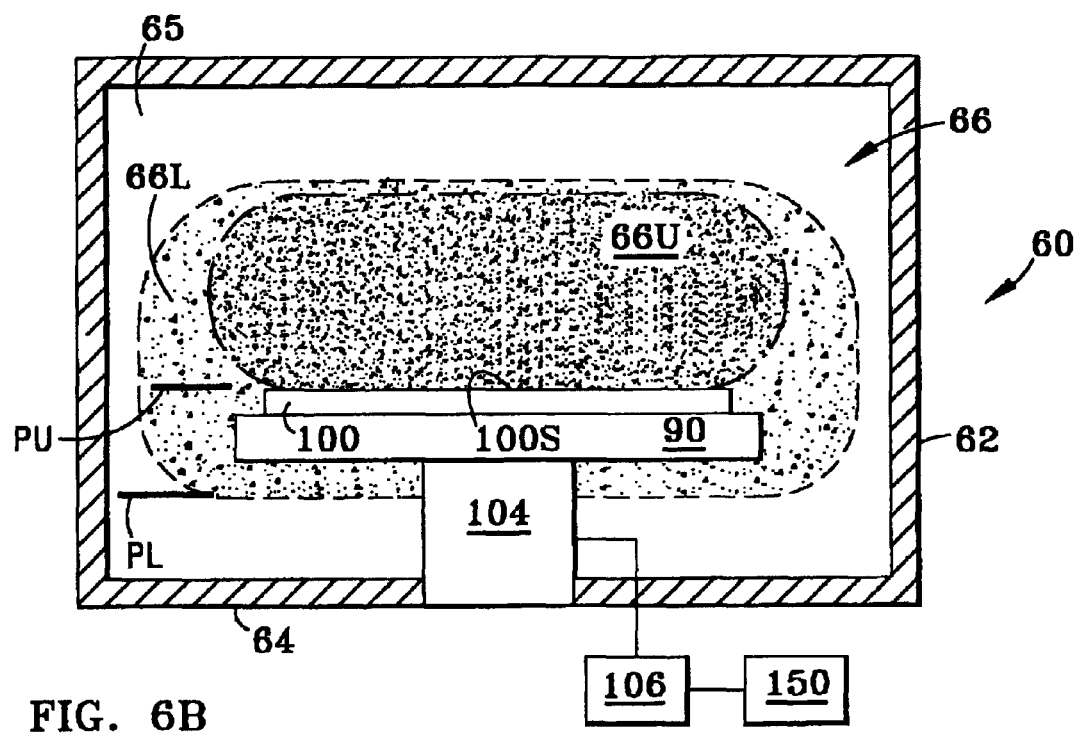

In performing step 305, the position of substrate 100 within chamber 60 is critical. With reference to FIGS. 6A and 6B, using lower wall 64 of chamber 60 as a reference, in a "lowered" position PL shown in FIG. 6A (i.e., where the substrate is closest to lower wall 64), substrate 100 is exposed to region 66L of plasma 66, where the plasma density is low (i.e., there is a small number of energetic ions), but where the density of oxidizing radicals is high (i.e., there is a very high concentration of oxygen [O] atoms and a low concentration of ionized oxygen atoms [$O^+$, $O^-$]). The effect of plasma region 66L on silylated regions S1 and S2 is that the increased presence of oxygen radicals increases the rate of oxidation of silylated regions S1 and S2 in forming oxide regions OR1 and OR2.

On the other hand, in an "upper" position PU shown in FIG. 6B (i.e., where the substrate is farthest from lower wall 64), substrate 100 is exposed to region 66U of plasma 66, where the fluence and density of ions in the vicinity of the substrate surface is large. The effect on the surface 100S of substrate 100 in this position is that a high density of ions in plasma 66 are attracted to substrate surface 100S via RF bias applied from RF generator in order to anisotropically etch photoresist layer L1 in a direction substantially perpendicular to substrate surface 100S.

The use of E-shield 88 results in a very low plasma potential, which means that if no bias is applied to the silicon substrate 100 from substrate RF power supply 116, the energy of the ions and the electrons in plasma 66 reaching substrate surface 100S will be very low. Thus, in the case of no external applied bias from substrate RF power supply 116, there is significantly reduced ionic bombardment of substrate 100. Adjusting the bias applied to substrate support member 90 by substrate RF power supply 116 increases the kinetic energy of ions arriving at the substrate surface 100S of substrate 100. In addition, tuning the amount of RF power from RF power supply 82 alters the plasma density in plasma 66, while maintaining the energy of the ions at substantially the same level (typically on the order of 5 to 100 eV depending upon the RF bias power). This allows for control over the anisotropic etch characteristics of plasma 66 in forming photoresist pattern having the desired sidewalls using the present dry etch process.

Accordingly, with reference to FIGS. 4A–E, a preferred embodiment for the dry development of the photoresist is now described in more detail. The dry developing process of step 305 comprises two sets of steps: high-pressure steps 305a–305e and low-pressure steps 305f–305h.

Figure 5:
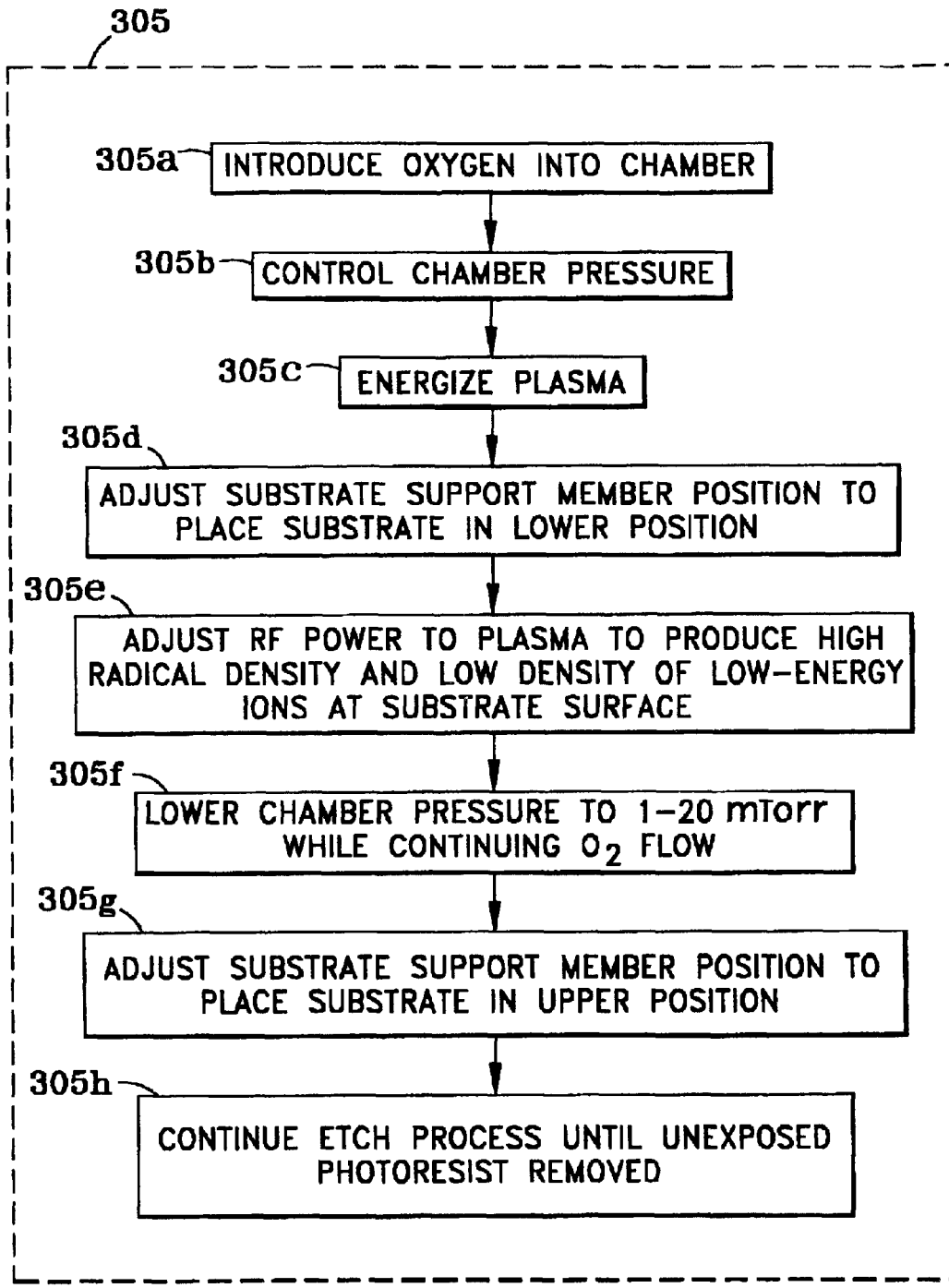
FIG. 5 is a flow diagram of the process steps comprising step 305 of the flow diagram of FIG. 3.

With reference to high-pressure steps 305a–305e in FIG. 5 and also to FIG. 3, in step 305a, oxygen is introduced to chamber 60 via gas supply system 130. Next, in step 305b, the pressure in chamber 60 is regulated to be within a range of 10–500 mTorr via vacuum pump system 120. Next, in step 305c, plasma 66 is energized via the application of RF power from RF power supply 82. With reference now also to FIG. 6A, in step 305d, lifting member control unit 106 is activated by control system 150 via an electronic signal to adjust substrate support member 90 and substrate 100 supported thereon through the activation of lifting member 104 to lower position PL within chamber 60. In step 305e, control system 150 then adjusts the RF power via electronic signals to RF supply system 82 and substrate RF supply system 116 to produce a high radical density and low density of low energy ions in plasma region 66L and thus at surface 100S of substrate 100. This step enables silylated regions S1 and S2 to rapidly oxidize to form oxide ($SiO_x$) regions OR1 and OR2.

With continuing reference to FIG. 5 and to low-pressure steps 305f–305h, in step 305f the pressure in chamber 60 is lowered to be within a range of approximately 1–20 mTorr using vacuum pump system 120, while continuing the flow of oxygen gas to chamber interior 65 from gas supply system 130. Next, with reference now also to FIG. 6B, in step 305g, lifting member control unit 106 is activated by control system 150 via an electronic signal to activate lifting member 104 to adjust substrate support member 90 and substrate 100 supported thereon to upper position PU within chamber 60. At upper position PU, the surface of substrate 100 is subject to a high density of low energy ions associated with plasma region 66U. The high density of relatively low energy ions allows for a high-rate anisotropic etch of the unsilylated resist, resulting in the formation of photoresist patterns P having sidewalls SW of a desired profile (e.g. vertical, such as shown in FIG. 4E). In step 305h, the etching process is continued until the unexposed photoresist is removed.

In practicing the above process, the main parameters that need to be quantified are the flow of oxygen gas into chamber 60 from gas supply system 130, the control of the chamber pressure via vacuum pump system 120 (in combination with the gas flow from the gas supply system), the RF bias power from substrate RF power supply system 116 (typically on the order of 100 W), the RF source power from RF power supply system 82 (which typically may be as high as 5 kW), and the position of substrate 100 in the chamber. As with many semiconductor processes, these parameters may need to be deduced empirically.

Subsequent processing of the resulting photoresist pattern may be performed in order to fabricate a semiconductor device. This subsequent processing may include an etch process for pattern transfer to a process layer previously formed in substrate 100, a doping process to dope the exposed regions of the process layer, or another process such as a deposition step. The all-dry lithography process can be completed in an integrated environment, such as a cluster tool as mentioned above, resulting in improved manufacturing cycle time and increased yields.

Although the above-described system 50 includes an ESRF plasma reactor, it will be understood that alternate systems, including a neutral loop plasma (a Faraday shield in the form of a coil partially inside the reactor), or an ultra high frequency plasma, or an inductively coupled plasma (ICP) system capable of forming a high-energy, low-potential plasma are also suitable for practicing the process of the present invention.

In fact, the many features and advantages of the present invention are apparent from the detailed specification and thus, it is intended by the appended claims to cover all such features and advantages of the described process which follow in the true spirit and scope of the invention. Further, since numerous modifications and changes will readily occur to those of ordinary skill in the art, it is not desired to limit the invention to the exact construction and operation illustrated and described. Moreover, the process and apparatus of the present invention, like related apparatus and processes used in the semiconductor arts tend to be complex in nature and are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A process of plasma etching a substrate having an upper surface coated with a first layer of silylatable material with one or more silylated regions formed therein, with an oxygen-based plasma having a first region with a low plasma density and high radical density, and a second region having a higher plasma density and a lower radical density than the first region, the process comprising the steps of:
   a) exposing the one or more silylated regions to the first plasma region to form respective one or more oxidized regions from the one or more silylated regions; and
   b) exposing the substrate to the second plasma region to selectively etch the first layer in regions other than the oxidized regions.

2. A process according to claim 1, wherein said selective etch in said step b) is anisotropic.

3. A process according to claim 2, wherein said anisotropic etch is in a direction substantially perpendicular to the substrate upper surface.

4. A process according to claim 1, wherein said substrate is exposed to said first and second plasma regions, respectively, by moving the substrate from a first position located within the first plasma region to a second position located within the second plasma region.

5. A process according to claim 4, wherein the silylatable material is photoresist.

6. A process according to claim 1, wherein the second plasma region has an ion flux and an ion energy, and said step b) includes the step of adjusting said ion flux while maintaining substantially the same ion energy.

7. A process according to claim 6, wherein the ion flux is adjusted by adjusting an amount of RF power coupled to the second plasma region.

8. A process according to claim 1, wherein the process is carried out in a chamber, and said step b) includes at least one of the steps of:
   a) adjusting an amount of RF power coupled to the second plasma region;
   b) adjusting a bias to the substrate;
   c) adjusting a flow of a gas to the plasma;
   d) adjusting the pressure within the chamber; and
   e) varying the position of the substrate within the chamber.

9. A process according to claim 8, wherein said gas is oxygen.

10. A process of patterning a substrate with a high-energy, low potential plasma having a first region having a high radical density and a low plasma density and a second region having a low radical density and a high plasma density, the process comprising:
    a) coating the substrate with a layer of silylatable material;
    b) forming silylated regions in said layer of silylatable material by exposing said exposed regions to a reagent while leaving unsilylated regions in said layer;
    c) converting said silylated regions to oxide regions by exposing said silylated regions to the first plasma region in the plasma; and
    d) etching the unsilylated regions of said silylatable material by exposing said silylatable material to the second plasma region.

11. A process according to claim 10, wherein said step b) includes the steps of:
    i) baking the layer of silylatable material; and
    ii) selectively exposing regions of the layer of silylatable material to actinic radiation.

12. A process according to claim 10, wherein said step d) includes the step of adjusting an amount of RF power coupled into the plasma.

13. A process of plasma etching a substrate having a layer of silylatable material with one or more silylated regions formed therein, the process carried out in a plasma chamber with the substrate position within the chamber being adjustable between first and second positions, comprising the steps of:
    a) flowing oxygen into the chamber;
    b) controlling the chamber pressure;
    c) energizing the plasma;
    d) adjusting the position of the substrate to the first position;
    e) adjusting an amount of RF power delivered to the plasma to produce high radical density and low plasma density at or near the substrate, thereby forming one or more oxide regions from the one or more silylated regions;
    f) lowering the chamber pressure while continuing the flow of oxygen into the chamber;
    g) adjusting the position of the substrate to the second position that exposes the substrate to a high plasma density and low radical density; and
    h) selectively etching the layer of silylatable material exposed to the plasma.

14. A process according to claim 13, further including the step of biasing the substrate.

15. A process according to claim 13, further including the step, after step h), of terminating etching after reaching a predetermined endpoint.

* * * * *